United States Patent [19]
Kondo et al.

[11] Patent Number: 5,331,211
[45] Date of Patent: Jul. 19, 1994

[54] RELEASING CIRCUIT FOR ACTUATING VEHICULAR SAFETY DEVICE

[75] Inventors: Akira Kondo; Motoharu Naitou, both of Okazaki; Toshiaki Ota, Anjo; Mitsuhiko Masegi, Nukata; Masao Sakurai, Ohbu, all of Japan

[73] Assignee: Nippondenso Co., Ltd., Kariya, Japan

[21] Appl. No.: 61,499

[22] Filed: May 14, 1993

Related U.S. Application Data

[63] Continuation of Ser. No. 726,118, Jun. 27, 1991, abandoned, which is a continuation of Ser. No. 359,473, May 23, 1989, abandoned.

[30] Foreign Application Priority Data

May 23, 1988 [JP] Japan ................................ 63-125343

[51] Int. Cl.$^5$ ............................................. B60R 21/16
[52] U.S. Cl. .................................. 307/10.1; 307/121; 280/735; 340/438
[58] Field of Search ............... 307/10.1, 121; 340/436, 340/438, 669; 280/734, 735; 180/274, 282, 268; 364/424.01, 424.05

[56] References Cited

U.S. PATENT DOCUMENTS

| | | | |
|---|---|---|---|
| 3,916,376 | 10/1975 | Tuttle | 280/735 |
| 4,059,822 | 11/1977 | Toshioka et al. | 340/436 |
| 4,158,191 | 6/1979 | Rogers et al. | 340/436 |
| 4,346,913 | 8/1982 | Schrauf et al. | 280/735 |
| 4,359,715 | 11/1982 | Langer | 340/436 |
| 4,381,829 | 5/1983 | Montaron | 180/274 |
| 4,410,875 | 10/1983 | Spies et al. | 280/735 X |
| 4,695,075 | 9/1987 | Kamiji et al. | 280/735 |
| 4,873,452 | 10/1989 | Morota et al. | 307/10.1 |

FOREIGN PATENT DOCUMENTS

| | | |
|---|---|---|
| 2808872 | 9/1979 | Fed. Rep. of Germany . |
| 2184307 | 12/1973 | France . |
| 87/00317 | 2/1988 | PCT Int'l Appl. . |

Primary Examiner—A. D. Pellinen
Assistant Examiner—Fritz M. Fleming
Attorney, Agent, or Firm—Cushman, Darby & Cushman

[57] ABSTRACT

A circuit for controlling the actuation of a vehicle air bag system includes a two terminal electrically actuated ignition element connectable to a drive voltage line through a first transistor and to a circuit ground through another transistor. The voltage source includes the vehicle battery and a capacitor that is charged by the vehicle battery and which supplies operating power in the event the vehicle battery is removed from the circuit, for example, as a consequence of a collision. The transistors are normally biased to a non-conducting state sufficient to isolate the ignition element from the drive voltage source and circuit ground. Vehicle acceleration is sensed by an acceleration sensor which, in the event of a collision, biases both transistors into conduction to effectively connect the two terminals of the ignition element to the drive voltage line and to ground to actuate the vehicle air bag. During normal operation, a bias circuit controls one of the transistors to provide a minute current flow that is used to sense fault conditions and illuminate an alarm lamp. During a collision, the acceleration sensing circuit re-configures the bias circuit to drive both transistors into conduction. A low-voltage circuit senses the drive voltage and controls the bias to the one transistor to inhibit the minute current flow to conserve power during low-voltage conditions.

41 Claims, 5 Drawing Sheets

RELEASING CIRCUIT FOR ACTUATING VEHICULAR SAFETY DEVICE

This is a continuation of application No. 07/726,118, filed Jun. 27, 1991, now abandoned, which was an FWC of Ser. No. 07/359,473 filed May 23, 1989 now abandoned.

BACKGROUND OF THE INVENTION

1. Field of the Invention

The present invention relates to vehicular safety devices such as air cushions, belt tighteners, or similar arrangements, and, more particularly, to a control circuit for activating a releasing circuit for the safety device in a more reliable manner.

2. Discussion of the Prior Art

In such a releasing circuit for the safety device as described above, a checking circuit is provided to check for the presence of a defect or malfunction in the releasing circuit. The checking circuit is, in general, designed to continuously supply an electric current from a vehicle battery to an ignition element of the safety device thereby to render the ignition element in an operable condition for checking. For this reason, it is required to reduce the power consumption from the battery to as small a value as possible. It is also assumed that, when the vehicle has been subjected to an accident, the ignition element may not be activated due to its disconnection from the battery. For the purpose of avoiding such a problem, a capacitor is adapted as a back-up power source for supplying a charged voltage therefrom to the ignition element, wherein the capacitor is arranged to be previously charged by the power from the battery. There will, however, occur a lapse of time due to the characteristic of an acceleration sensor prior to supply of the charged voltage from the capacitor to the ignition element. If in this instance a large amount of electric current was supplied to the checking circuit from the capacitor before the lapse of time, the ignition element would not be activated due to an insufficient supply of the charged voltage from the capacitor.

SUMMARY OF THE INVENTION

It is, therefore a primary object of the present invention to provide a control circuit for the releasing circuit capable of activating the ignition element in a more reliable manner without causing undesired power consumption from an electric power source.

According to the present invention, the primary object is accomplished by providing a releasing circuit for actuating a safety device to protect passengers of a vehicle, comprising an acceleration sensor arranged to provide an electric acceleration signal responsive to acclerations of the vehicle and an evaluating circuit for setting a predetermined condition for actuating an ignition element of the safety device and responsive to the acceleration signal from the acceleration sensor for effecting the activation of said ignition element when the predetermined condition has been satisfied by the acceleration signal, wherein a control circuit for the releasing circuit comprises:

first means responsive to an output signal from the evaluating circuit for controlling the electric power supply to the ignition element from an electric power source;

second means responsive to the output signal from the evaluating circuit for controlling the first means in such a manner that the first means acts to maintain the electric power supplied to the ignition element at a predetermined small value until the condition for activation of the ignition element is satisfied by the acceleration signal and for controlling the first means in such a manner that the first means acts to increase the electric power supplied to the ignition element up to a predetermined large value when the condition for activation of the ignition element has been satisfied by the acceleration signal; and third means for prohibiting an increase of the electric power under control of the second means in a condition where the ignition element has to be maintained inoperative.

BRIEF DESCRIPTION OF THE DRAWINGS

Other objects, features and advantages of the present invention will be readily appreciated from the following detailed description of certain preferred embodiments thereof when considered with reference to the accompanying drawings, in which.

DESCRIPTION OF THE PREFERRED EMBODIMENT

Figure 1:
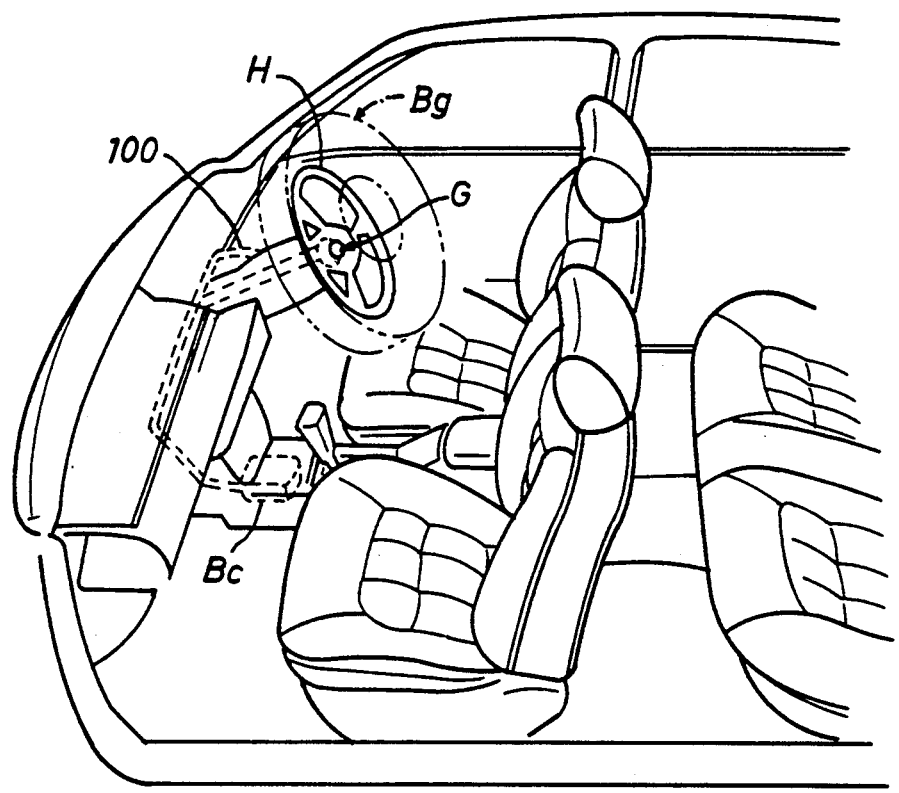
FIG. 1 is a partly cut away elevation of an automobile equipped with an air cushion system for the driver.
Figure 2:
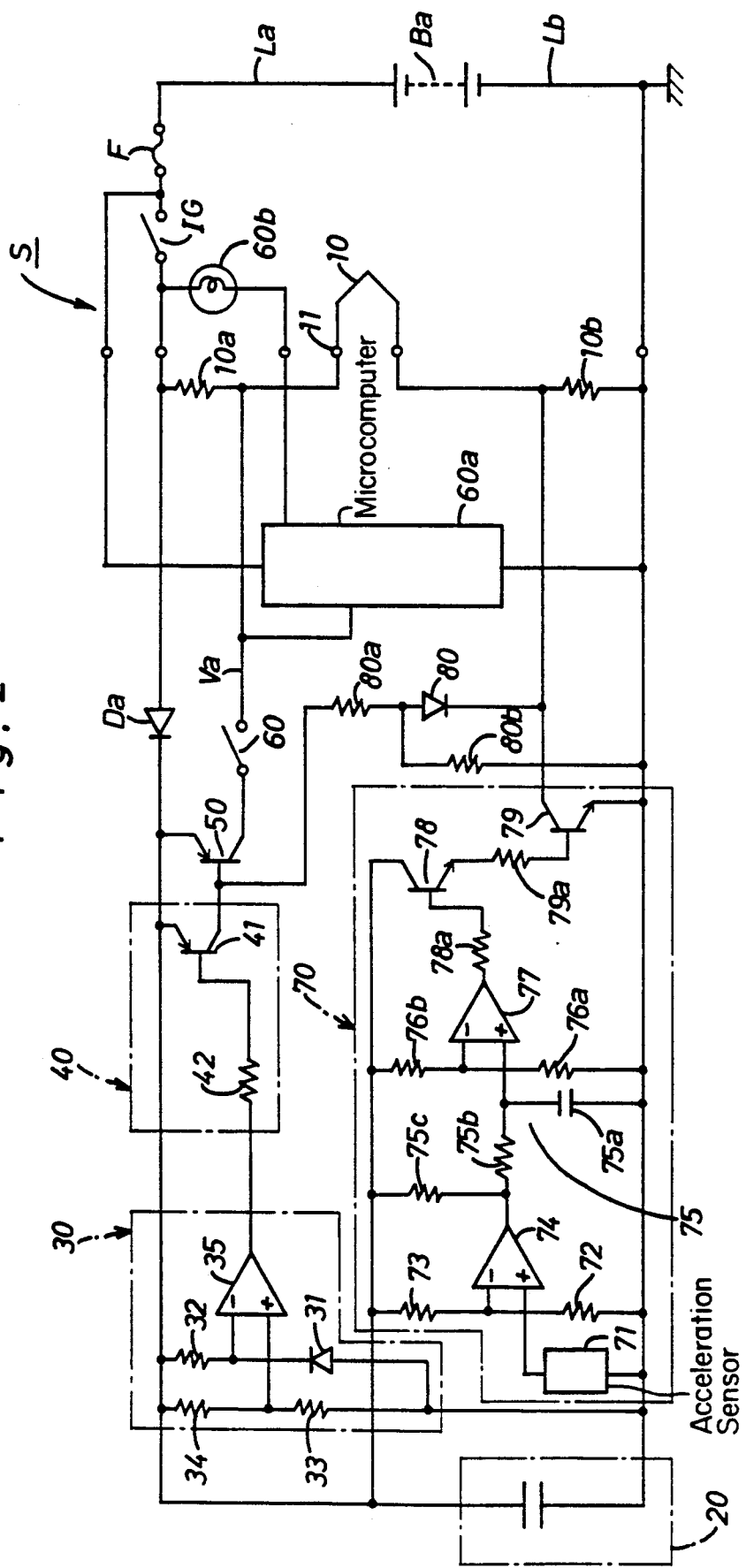
FIG. 2 is a circuit diagram of a releasing circuit with a control circuit in accordance with the present invention.

Disclosed in FIG. 1 of the drawings is an automobile equipped with an air cushion system which includes an air bag Bg (dotted-line illustration) for the driver normally disposed within a steering wheel H, a gas generator G mounted in the air bag Bg, and a releasing circuit unit S (not shown in FIG. 1) in a control box Bc arranged in the vehicle compartment. The gas generator G is provided therein with an ignition element 10 which (not shown in FIG. 1) is energized by an input current applied thereto under control of the releasing circuit unit S to burst the gas generator G for rapidly inflating the air bag Bg. As shown in FIG. 2, the releasing circuit unit S comprises a back-up power supply source in the form of a capacitor 20 which is grounded at its one end and connected at its other end to the positive terminal of a main power supply source in the form of a vehicle battery Ba through a diode Da, a vehicle ignition switch IG, a fuse F and a power source line La. The capacitor 20 is charged by DC voltage applied thereto from the battery Ba through the power source line La, fuse F, ignition switch IG and diode Da. The electrostatic capacity of capacitor 20 is determined in a large value taking into account the predetermined amount of an electric current which flows continuously into the ignition element 10 for a predetermined time duration to activate the ignition element 10. In addition, the negative terminal of battery Ba is grounded through a power source line Lb.

A voltage detection circuit 30 includes a zener diode 31 which is arranged to be turned on in response to the DC voltage applied thereto from the battery Ba through the power source line La, fuse F, ignition switch IG, diode Da and a resistor 32 for generating a reference voltage at its output terminal. A pair of resistors 33, 34 are connected in series with each other and arranged to generate a detection voltage at their common terminal when applied with the DC voltage from battery Ba through the power source line La, fuse F, ignition switch IG and diode Da. A comparator 35 is arranged to compare the detection voltage from resistors 33, 34 with the reference voltage from zener diode 31. When the detection voltage is lower than the reference voltage, the comparator 35 generates a low level signal therefrom. When the detection voltage is higher than the reference voltage, the comparator 35 generates a high level signal therefrom, indicative of an abnormally low voltage. In this embodiment, the low level signal from comparator 35 represents an abnormal condition of the DC voltage, whereas the high level signal from comparator 35 represents a normal condition normal of the DC voltage.

Figure 3:
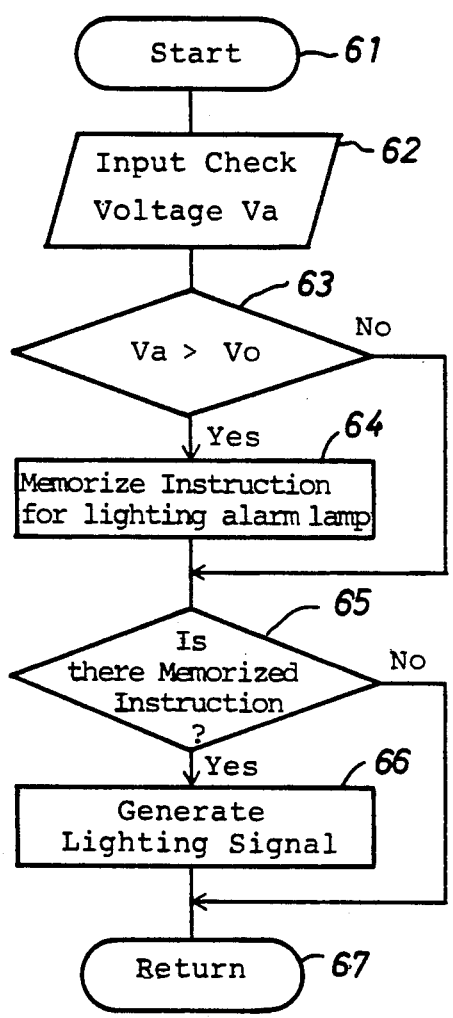
FIG. 3 is a flow chart of a program executed by a computer in the control circuit.

A prohibition circuit 40 includes a transistor 41 arranged to be turned on when applied with the low level signal from comparator 35 through a resistor 42 and to be turned off in response to the high level signal applied thereto from comparator 35. The emitter of transistor 41 is grounded through the capacitor 20 and connected to the positive terminal of battery Ba through diode Da, ignition switch IG, fuse F and power supply line La. A transistor 50 is connected at its base directly to the collector of transistor 41. The emitter of transistor 50 is grounded through the capacitor 20 and connected to the ignition switch IG through diode Da. The transistor 50 is arranged to be activated in accordance with a bias voltage applied thereto from the transistor 41. An acceleration switch 60 of the normally open type is in the form of a mercury switch which is connected at its one end to the collector of transistor 50 and at its other end to the ignition switch IG through a resistor 10a with a high resistance value. The switch 60 is further grounded at its other end through the ignition element 10 and a resistor 10b with a high resistance value. When the vehicle acceleration is maintained to be equal to or higher than a predetermined low value, the acceleration switch 60 is closed to electrically connect the ignition element 10 to the collector of transistor 50. A microcomputer 60a is arranged to cooperate with the acceleration switch 60 to execute a computer program for control of an alarm lamp 60b as shown by a flow chart in FIG. 3. The computer program is previously stored in the read-only memory or ROM of computer 60a. The computer 60a is always maintained in an operative condition by the electric power supplied thereto from battery Ba through power source line La and fuse F.

An evaluating circuit 70 includes an acceleration sensor 71 which dectects the vehicle acceleration to generate therefrom an acceleration voltage indicative of the vehicle acceleration. The acceleration sensor 71 has a delay characteristic in its operation dependent on the vehicle acceleration. A pair of resistors 72, 73 are connected in series with each other and arranged to generate a reference voltage at their common terminal when applied with the charged voltage from capacitor 20 or the DC voltage from battery Ba through power source line La, fuse F, ignition switch IG and diode Da. The reference voltage defined by resistors 72, 73 corresponds to a slight low acceleration rather than that caused by an abnormal sudden change of the vehicle acceleration. A comparator 74 is arranged to generate a low level signal therefrom when applied with the acceleration voltage from sensor 71 at a lower level than the reference voltage defined by resistors 72, 73. The comparator 74 outputs a high level signal therefrom when applied with the acceleration voltage from sensor 71 at a higher level than the reference voltage, this high-level signal indicate of abnormal acceleration.

An integrator 74 includes a capacitor 75a arranged to be charged in response to the high level signal from comparator 74 by the DC voltage applied thereto from battery Ba through power source line La, fuse F, ignition switch IG, diode Da and resistors 75c, 75b or the charged voltage applied thereto from the capacitor 20 through resistors 75c, 75b. In such an arrangement, the capacitor 75a generates an integration voltage at its output terminal when it has been charged. The integration voltage from capacitor 75a drops immediately after application of a low level signal from comparator 74 through resistor 75b. A pair of resistors 76a, 76b are connected in series with each other and arranged to generate a reference voltage at their common terminal when applied with the DC voltage from battery Ba through power source line La, fuse F, ignition switch IG and diode Da or the charged voltage from capacitor 20. The reference voltage defined by resistors 76a, 76b corresponds to a predetermined voltage necessary for determining as to whether or not the vehicle acceleration has suddenly changed in an abnormal condition. A comparator 71 is arranged to generate a low level signal therefrom when applied with the integration voltage from capacitor 75a at a lower level than the reference voltage defined by resistors 76a, 76b and to generate a high level signal therefrom when applied with the integration signal from capacitor 75a at a higher level than the reference voltage. A transistor 78 is arranged to be turned on when applied with the high level signal from comparator 77 through a resistor 78a and to be turned off when applied with the low level signal from comparator 77. The collector of transistor 78 is grounded through the capacitor 20 and is further connected to the positive terminal of battery Ba through diode Da, ignition switch IG, fuse F and power source line La. A transistor 79 is biased by a resistor 79a to be turned on in response to activation of the transistor 78. The transistor 79 is inversely turned off in response to deactivation of the transistor 78. In this instance, the activation of transistors 79 (i.e., the biasing of transistor 79 into conduction) represents the fact that the vehicle acceleration has suddenly changed in an abnormal condition, whereas the deactivation of transistor 79 represents the fact that the vehicle acceleration is maintained in a normal condition.

Hereinafter, the inventive subject matter of the present invention will be described in detail. A diode 80 has a cathode connected to the collector of transistor 79 and an anode connected to the base of transistor 50 through a resistor 80a and is grounded through a resistor 80b. When the transistor 79 is being turned off, the diode 80 is inversely biased by a difference between resistance values of resistors 10b, 80b to be turned off. When the transistor 79 is being turned on, the diode 80 is grounded at its cathode through transistor 79 to be turned on.

In this embodiment, the resistance values of resistors 80a, 80b are determined taking into account of the following matters. For detecting a defect or short circuit of the acceleration switch 60, it is needed to continuously flow a minute current through transistor 50, acceleration switch 60, ignition element 10 and resistor 10b in a condition where the acceleration switch 60 has been normally closed and maintained in the closed position. For this reason, the sum of resistance values of resistors 80a, 80b is determined in such a manner that the transistor 50 is applied at its base with a bias voltage necessary for flowing the minute current as mentioned above. For activating the ignition element 10 in a more reliable manner, it is necessary to apply a desired current of a few amperes (A) to the ignition element 10 for a predetermined time duration. For this reason, the resistance value of resistor 80a is determined in such a manner that the bias voltage of transistor 50 is controlled to apply the desired current to the ignition element 10 even if the battery Ba was disconnected from one of the power source lines La and Lb during an abnormal sudden change of the vehicle acceleration. On the other hand, the resistance value of resistor 80b is determined to inversely bias the diode 80 in response to deactivation of the transistor 79 and to control the bias voltage of transistor 50 for maintaining the minute current applied to the ignition element 10 during deactivation of the diode 80.

Assuming that in operation the comparator 35 of voltage detection circuit 30 is conditioned to generate a high level signal therefrom after the ignition switch IG was closed, the transistor 41 of prohibition circuit 40 is maintained in a deactivated condition. In such a condition, the transistor 50 is maintained at a low conductive state in accordance with a bias voltage defined by the sum of resistance values of resistors 80a and 80b. When the acceleration switch 60 is maintained in its normally open position, a check voltage Va appearing between the terminal 11 of ignition element 10 and the fixed terminal of the acceleration switch 60 is defined by the ratio of the resistance value of resistor 10a against the sum of the resistance values of resistors 10a and 10b in relation to the DC voltage of battery Ba. When the check voltage Va is equal to or lower than a predetermined voltage Vo, the computer 60a receives the check voltage Va at a step 62 of the computer program shown in FIG. 3 to determine a "No" answer subsequently at steps 63 and 65.

In case the acceleration switch 60 is short circuited in error, a minute current from battery Ba will be supplied to the ignition element 10 through transistor 50 and switch 60 under the low conductive state of transistor 50. Thus, the computer determines a "Yes" answer at step 63 to memorize at step 64 in instruction for illuminating the alarm lamp 60b. Subsequently, the computer determines a "Yes" answer at step 65 to generate a lighting signal at step 66. As a result, the alarm lamp 60b is illuminating in response to the lighting signal from computer 60a. In addition, the capacitor 20 is charged by the DC voltage applied thereto from battery Ba through power source line La, fuse F and diode Da. It is assumed that the battery Ba is disconnected from one of the power source lines La and Lb due to an abnormal sudden change of the vehicle acceleration in a condition where the acceleration switch 60 has been normally closed after the vehicle started. In this instance, the acceleration sensor 71 will generate an acceleration signal therefrom after lapse of a delay time, and in turn, the acceleration signal becomes higher than a reference voltage defined by resistors 72, 73 under the charged voltage from capacitor 20. Then, the comparator 74 generates a high level signal therefrom, and in turn, the integrator 75 generates an integration voltage. In this instance, the transistor 79 is still maintained in a deactivated condition due to a low level signal from comparator 77. Thus, the base current of transistor 50 is restrained by resistors 80a, 80b to maintain the low conductive state of transistor 50. This is effective to minimize the consumption of electric energy supplied from the capacitor 20 after disconnection of battery Ba.

When the integration voltage from capacitor 75a exceeds the reference voltage from resistors 76a, 76b caused by the charged voltage from capacitor 20, the transistor 78 is turned on and, in turn, the transistor 79 is turned on to activate the diode 80. This means that the resistor 80b is shorted by diode 80. Thus, the transistor 50 is biased at its base deeply by the resistor 80a to facilitate its conductive state up to a saturation state. As a result, an amount of an electric current flowing into the transistor 79 from capacitor 20 through transistor 50, acceleration switch 60 and ignition element 10 increases up to the desired amount. In this instance, consumption of charged electric energy from capacitor 20 after disconnection of battery Ba is minimized as described above. Thus, in spite of disconnection of battery Ba, the electric current from capacitor 20 to ignition element 10 is maintained with the desired amount and time duration to activate the ignition element 10 so as to rapidly inflate the air bag Bg as shown by imaginary lines in FIG. 1.

As is understood from the above description, the base current of transistor 50 is maintained to be zero in a prohibited condition of the air cushion system, maintained to be a relatively small value capable of flowing a minute current through the acceleration switch 60 prior to activation of the ignition element 10, and maintained to be a relatively large value capable of flowing an sufficient current through the ignition element 10 at its activation. Thus, the consumption of electric energy of capacitor 20 can be effectively minimized, and the time duration for activating the ignition element 10 can be reliably ensured by capacitor 20.

Figure 4:
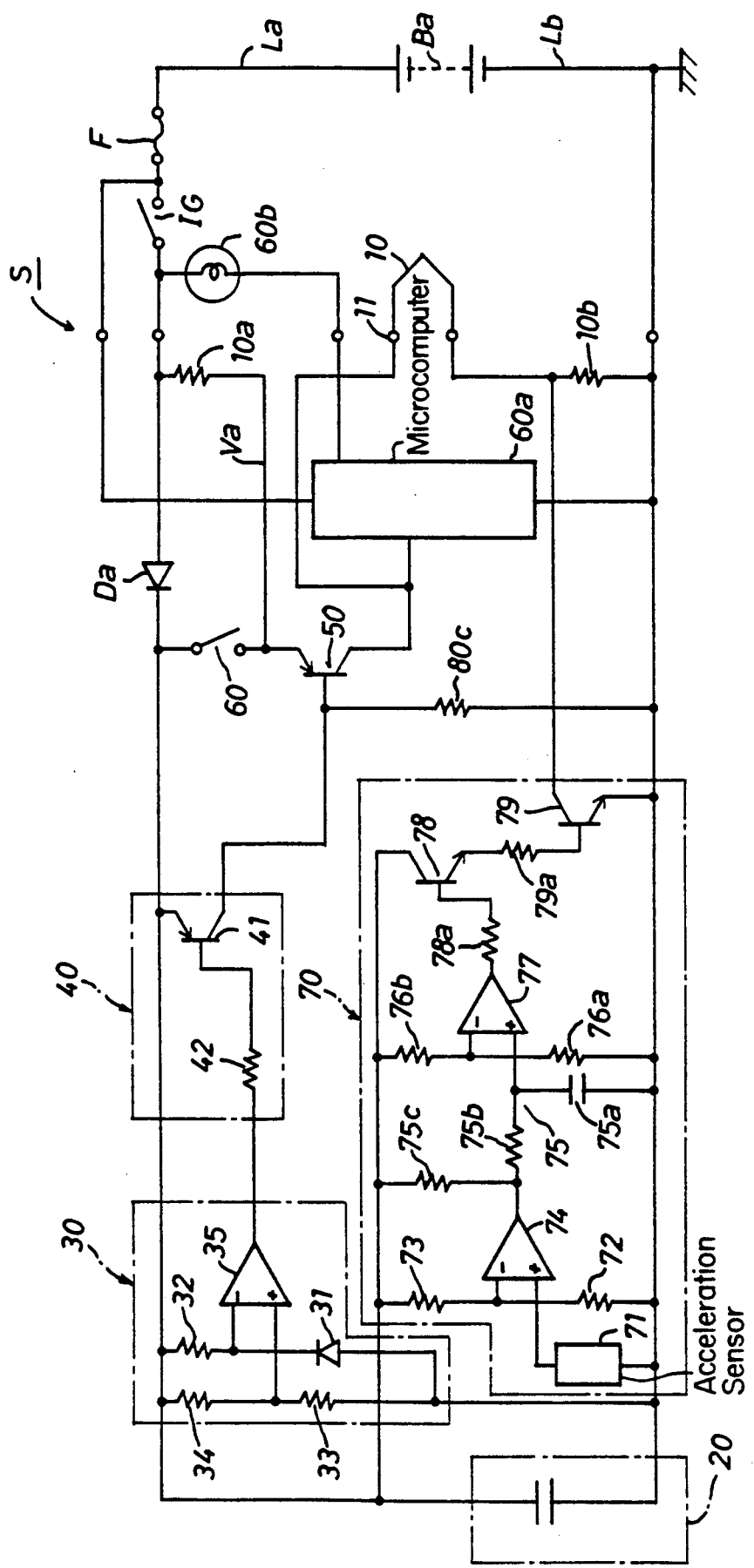
FIG. 4 is a circuit diagram of a modification of the control circuit shown in FIG. 2.

FIG. 4 illustrates a modification of the above embodiment. In this modification, the acceleration switch 60 is connected between the emitter of transistor 50 and the cathode of diode Da. The transistor 50 is grounded at its base through resistor 80c and connected at its emitter and collector to the resistor 10a and ignition element 10, respectively. In addition, the resistors 80a, 80b and diode 80 are eliminated. Other construction of the modification is substantially the same as that of the above embodiment.

In operation, when the transistor 41 is turned off in the same manner as described above, the transistor 50 is turned on at its low conductive state caused by the resistors 10a, 80c. In this instance, a check voltage Va under the normally opened condition of acceleration switch 60 is defined as the same as the above embodiment. Thus, the computer 60a executes the program in relation to the check voltage Va to determine as to whether or not the acceleration switch 60 is shorted.

When the battery Ba is disconnected from one of power source lines La, Lb under normal closure of acceleration switch 60, the transistor 79 is maintained in its deactivation condition. Therefore, even if the power supply from capacitor 20 is replacement of that from battery Ba is effected as decribed above, a base current of transistor 50 is limited by resistor 80c to restrain a current flowing through ignition element 10 in a value maintaining deactivation of the ignition element 10 in relation to resistor 10b. This is effective minimize the consumption of electric energy from capacitor 20 after disconnection of the battery Ba.

When the transistor 79 is turned on, the resistor 10b is shorted to maintain the current from capacitor 20 to the ignition element 10 in such a manner to reliably activate the ignition element 10. As is understood from the above description, consumption of electric energy from capacitor 20 to ignition element 10 can be minimized without surplus electric elements. In addition, the activation of transistor 50 is prohibited by activation of transistor 41.

Figure 5:
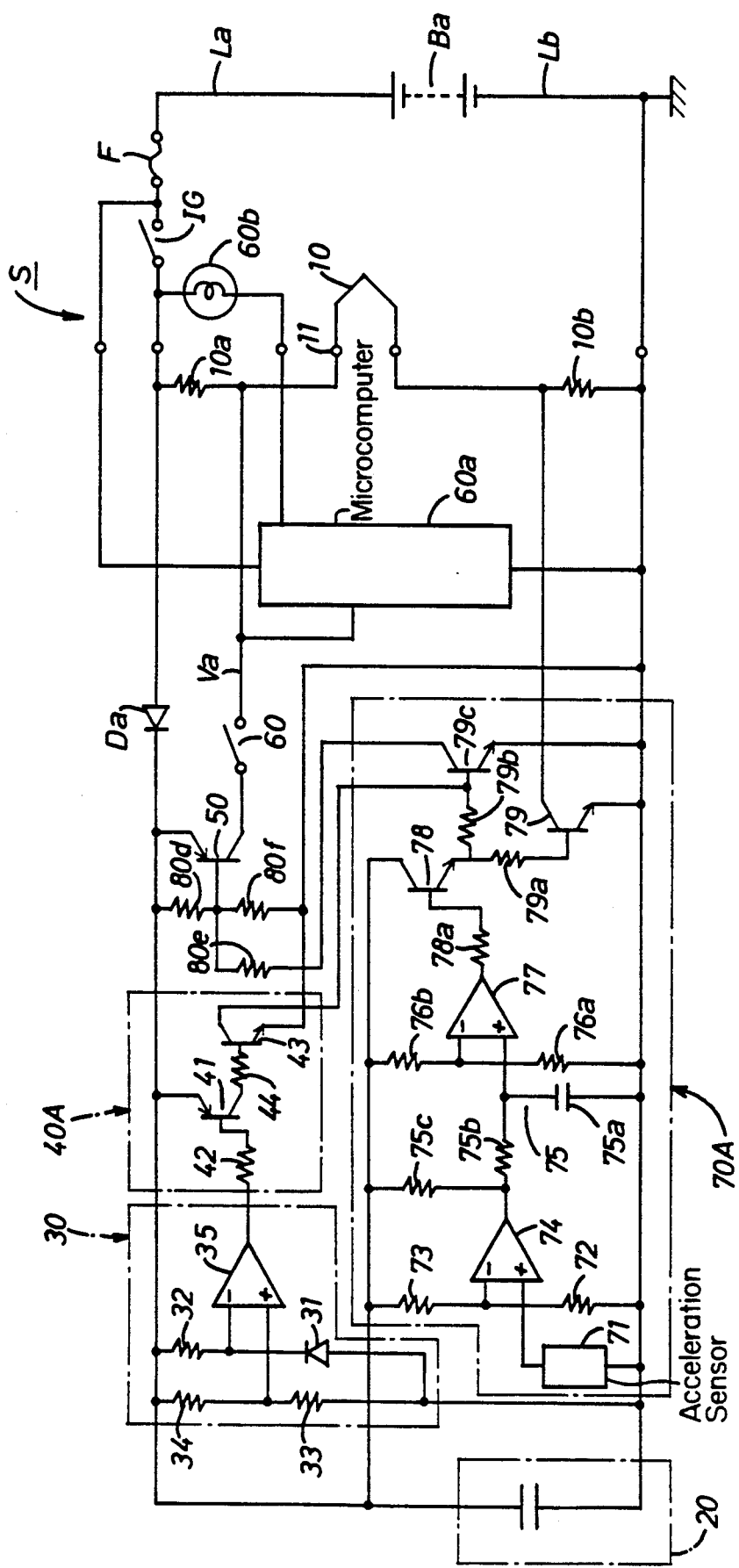
FIG. 5 is a circuit diagram of another modification of the control circuit shown in FIG. 2.

FIG. 5 illustrates another modification of the above embodiment wherein a prohibition circuit 40A and an evaluating circuit 70A are adapted in replacement of the evaluating circuit 40 and prohibition circuit 70, respectively and wherein resistors 80d, 80e, 80f are adapted in replacement of diode 80 and resistors 80a, 80b. The prohibition circuit 40A includes a transistor 43 and a resistor 44. The transistor 43 is turned on or off by resistor 44 in response to activation or deactivation of transistor 41. The transistor 43 is grounded at its emitter. Other construction of circuit 40A is substantially the same as that of circuit 40 in the above embodiment. The evaluating circuit 70A comprises a resistor 79b and a transistor 79c. The transistor 79c is connected at its base to the collector of transistor 43 and to the emitter of transistor 78 through resistor 79b. Thus, the transistor 79c is maintained in a deactivated condition in response to activation of the transistor 43. While the transistor 43 is maintained in a deactivated condition, the transistor 79c is turned on or off in response to activation or deactivation of the transistors 78, 79. Other construction of circuit 70A is substantially the same as that of circuit 70. A resistor 80d has one end connected to the emitter of transistor 50 and the other end connected to the base of transistor 50. The other end of resistor 80d is further connected through resistor 80e to the collector of transistor 70c and grounded through resistor 80f. In this case, a resistance value of resistor 80f is determined to be larger than that of resistor 80e. The resistor 80d, 80f are arranged to divide the DC voltage from battery Ba or charged voltage from capacitor 20 during deactivation of the transistor 79c into a divided voltage and to apply it to the base of transistor 50 as a bias voltage for activating the transistor 50 at its low conductive state. During activation of the transistor 79c, the resistors 80d, 80e are arranged to divide the DC or charged voltage into a divided voltage and to apply it to the base of transistor 50 as a bias voltage for activating the transistor 50 to its high conductive state. In addition, resistance values of resistors 80d, 80f are determined to restrain an electric current flowing into ignition element 10 in a value maintaining activation of element 10, even if the transistor 79 is turned on under deactivation of transistor 79c.

In operation, when the transistor 41 of prohibition circuit 40A is turned off in the same manner as described above, the transistor 43 is turned off. Thus, the transistor 50 is turned on at its low conductive state caused by the resistor 80d, 80f. In this instance, a check voltage Va under the normally opened condition of acceleration switch 60 is defined in the same manner as described above. Then, the computer 60a executes the program in relation to the check voltage Va to determine as to whether or not the acceleration switch 60 is shorted.

When the battery Ba is disconnected from one of power source lines La, Lb under normal closure of acceleration switch 60, the transistor 79 is maintained in its deactivated condition. Thus, the transistor 50 is maintained at its low conductive state by the resistors 80d, 80f, even if the power supply from capacitor 20 in replacement of that from battery Ba is effected as previously described. This is effective to minimize consumption of charged energy of capacitor 20 after disconnection of battery Ba.

When the transistor 79 is turned on, the resistor 10b is shorted, and transistor 79c is activated. Then, the transistor 50 is turned on at its high conductive state by the divided voltage from resistors 80d, 80e such that it maintains an electric current from capacitor 20 to ignition element 10 capable of reliably activating it. This is effective in high probability to minimize consumption of charged energy from capacitor 20 and to activate the ignition element 10.

In case that the transistor 43 is turned on, activation of transistor 79c is reliably prohibited regardless of activation of transistor 79. Thus, the transistor 50 is maintained at its low conductive state to prevent the ignition element 10 from its activation in spite of activation of transistor 79.

Although in the above embodiment the present invention has been adapted to a releasing circuit for an air cushion system, it may be adapted to a releasing circuit for a seat belt tightener or similar protective shock absorbing device.

While in the above embodiment and modifications a junction type transistor is adapted as the transistor 50, a field effect transistor or FET may be adapted as the transistor 50 in replacement of the junction type transistor. In the modification, it is preferrable that a control circuit for controlling an input voltage for the gate of FET is arranged to be controlled by the evaluating circuit 70 (or 70A) or acceleration switch 60. This is effective to decrease consumption of electric energy in the control circuit.

Although in the above embodiment and modifications the air cushion system is maintained inoperative under deactivation of transistor 50 caused by lowering of the voltage from battery Ba or capacitor 20 to a predetermined level, it may be also maintained inoperative by the instant detection of abnormal condition of the release circuit.

For the actual practice of the present invention the transistor 50 may be connected to a portion of the release circuit through which an electric current for activating the ignition element 10 flows. Although in the above embodiment the diode 80 is connected in series with the resistor 80a, it may be replaced with various semiconductor switch elements.

For the actual practice of the present invention, the present invention may be also adapted to a release circuit for a air cushion system without the back up power source in the form of capacitor 20. This is effective to decrease consumption of electric energy from battery Ba.

Having now fully set forth structure and operation of a preferred embodiment of the concept underlying the present invention, various other embodiments as well as certain modifications and variations of the embodiment shown and described herein will obviously occur to those skilled in the art becoming familiar with the underlying concept. It is to be understood, therefore, that within the scope of the appended claims, the invention may be practiced otherwise than as specifically set forth herein.

What is claimed is:

1. A release circuit for a vehicle passenger-safety device having a current-actuated release element connectable to an electrical power source for actuation thereof, comprising:
a controllable semiconductive device in a circuit path between the release element and the electrical power source and biasable from and between a non-conducting state and a current-conducting state sufficient to actuate the release element;
means connected to the electrical power source and the controllable semiconductor device for detecting the voltage of the electrical power source and for controlling the controllable semiconductor device to its non-conducting state to prohibit conduction when the voltage of the electrical power source is below a selected value; and
means for sensing the acceleration of the vehicle and providing an electrical signal thereof indicative of abnormal acceleration to the controllable semiconductor device to control the controllable semiconductor device to the current-conducting state sufficient to actuate the release element, the abnormal acceleration signal controlling the controllable semiconductor device to the current-conducting state sufficient to actuate the release element irrespective to the means for detecting controlling the controllable semiconductor device to its non-conducting state to prohibit conduction.

2. The releasing circuit of claim 1, further comprising:
bias circuit means connected in circuit with the controllable semiconductor device for biasing the controllable semiconductor device to an intermediate conduction state between the non-conducting state and the conduction state sufficient to actuate the release element, the controllable semiconductor device, when biased to the intermediate conduction state, providing a current flow in at least a portion of the circuit path between the release element and the electrical power source, the current flow insufficient to actuate the release element.

3. The releasing circuit of claim 2, wherein the bias circuit is connected in circuit with the controllable semiconductor device and the acceleration sensing means and biases the controllable semiconductor device to its conduction state sufficient to actuate the release element in response to the abnormal acceleration signal.

4. The releasing circuit of claim 3, wherein the controllable semiconductor device comprises a bipolar junction transistor and the bias circuit is connected in circuit with the base of the transistor.

5. The releasing circuit of claim 4, wherein the bias circuit comprises at least one resistor connected between the base of the transistor and a circuit ground.

6. The releasing circuit of claim 5, wherein the bias circuit further comprises a second resistor in series circuit with the first resistor and a diode connected to the acceleration sensing means and to the second resistor to shunt the second resistor in response to the abnormal acceleration signal to control the transistor to the conduction state sufficient to actuate the release element.

7. The releasing circuit of claim 5, wherein the bias circuit comprises at least a second resistor connected to the base of the transistor to shunt the first resistor in response to the abnormal acceleration signal to control the transistor to the conduction state sufficient to actuate the release element.

8. The releasing circuit of claim 4, wherein the means for sensing the acceleration further comprises a second controllable semiconductor device that is rendered conductive in response to sensed abnormal acceleration and non-conductive in the absence of abnormal acceleration.

9. The releasing circuit of claim 8, wherein the bias circuit comprises at least one resistor connected between the base of the transistor and a circuit ground.

10. The releasing circuit of claim 9, wherein the bias circuit further comprises a second resistor in series circuit with the first resistor and a diode connected in series circuit with the second controllable semiconductor device to shunt the second resistor in response to the abnormal acceleration signal to control the transistor to the conduction state sufficient to actuate the release element.

11. The releasing circuit of claim 9, wherein the bias circuit comprises at least a second resistor connected to the base of the transistor and the second controllable semiconductor device to shunt the first resistor in response to the abnormal acceleration signal to control the transistor to the conduction state sufficient to actuate the release element.

12. The releasing circuit of claim 1, wherein the electrical power source comprises:
a battery and an electrical storage capacitor in parallel circuit with the battery, the electrical storage capacitor having sufficient capacitance to store a charge for supplying a current flow sufficient to actuate the release element when the battery is out of circuit with the battery.

13. A releasing circuit for a safety device having a release element (10) actuable in response to a current sufficient for activation thereof provided through a current path from at least one of a battery (Ba) and a capacitor (20) charged by said battery (Ba) through said current path, the safety device actuable in response to activation of the release element (10) to protect passengers of a vehicle, comprising:
an acceleration sensor (71) for providing an acceleration signal responsive to accelerations of the vehicle,
evaluating circuit means (70,70A) for evaluating the acceleration signal from said acceleration sensor (71) in relation to a predetermined evaluating condition for supplying said sufficient current to the release element (10) from at least one of said battery (Ba) and said capacitor (20) and for generating an evaluating signal when the predetermined evaluating condition is satisfied,
first means (50,10a,60) controllable in at least a low conducting state and a high conducting state provided within said current path and for supplying a minute current continuously to the release element (10) from at least one of said battery (Ba) and said capacitor (20) through said current path when controlled in a low conducting state thereof and for supplying said sufficient current to the release element (10) from at least one of said battery (Ba) and said capacitor (20) through said current path when controlled in a high conducting state thereof,
second means (79,79c,10b,80,80a-80f) including control means maintainable in a first condition to control said first means (50,10a,60) in the low conducting state and maintainable in a second condition to control said first means (5,10a,60) in the high conducting state, said second means arranged for effecting the first condition of said control means when said evaluating circuit means (70,70A) does not generate any evaluating signal and for effecting the second condition of said control means in response to the evaluating signal from said evaluating circuit means (70,70A), and third means (30,40,40A) including means for detecting a decrease of an electric voltage from at least one of said battery (Ba) and said capacitor (20) relative to a reference value to generate a detecting signal therefrom, said third means prohibiting operation of said first means (50,10a,60) in response to said detected voltage decrease.

14. A releasing circuit as recited in claim 13, wherein said first means (50,10a,60) includes first semiconductor means (50) and a resistor (10a) with a high resistance value which are provided in parallel with each other within said current path, said first semiconductor means (50) supplying a minute current continuously to the release element (10) from at least one of said battery (Ba) and said capacitor (20) when controlled in a low conducting state thereof and supplying said sufficient current to the release element (10) from at least one of said battery (Ba) and said capacitor (20) when controlled in a high conducting state thereof, wherein said control means is maintainable in the first condition to control said first semiconductor means (50) in the low conducting state and maintainable in the second condition to control said first semiconductor means (50) in the high conducting state, and wherein said third means (30,40,40A) prohibits operation of said first semiconductor means (50) in response to the detection signal.

15. A releasing circuit as recited in claim 13, wherein said first means includes:

switch means (60) and a resistor (10a) with a high resistance value which are provided in parallel with each other within said current path, said switch means (60) shunting said resistor (10a) when actuated in response to an increase of a value of the acceleration signal up to a predetermined low value, and semiconductor means (50) associated with said switch means (60) and said resistor (10a) and for supplying a minute current continuously to the release element (10) from at least one of said battery (Ba) and said capacitor (20) when controlled in a low conducting state thereof and for supplying said sufficient current to the release element (10) from at least one of said battery (Ba) and said capacitor (20) when controlled in a high conducting state when said resistor (10a) is shunted, wherein said control means (80c,10b) is maintainable in the first condition to control said semiconductor means (50) in the low conducting state and maintainable in the second condition to control said semiconductor means (50) in the high conducting state, and wherein said third means (30,40) prohibits operation of said semiconductor means (50) in response to the detection signal.

16. A releasing circuit as recited in claim 13, wherein said second means includes second semiconductor means (79) that is non-conductive when said evaluating circuit means (70,70A) does not produce any evaluating signal and conductive in response to the evaluating signal from said evaluating circuit means (70,70A), and wherein said control means (10b,80,80a,80b) is a bias circuit means responsive to non-conduction of said second semiconductor means (79) for biasing said first means (50,10a,60) in the low conducting state and responsive to conduction of said second semiconductor means (79) for biasing said first means (50,10a,60) in the high conducting state.

17. A releasing circuit as recited in claim 13, wherein said first means (50,10a,60) includes first semiconductor means (50) and a resistor (10a) with a high resistance value which are provided in parallel with each other within said current path, said first semiconductor means (50) supplying a minute current continuously to the release element (10) from at least one of said battery (Ba) and said capacitor (20) when controlled in a low conducting state thereof and for supplying said sufficient current to the release element (10) from at least one of said battery (Ba) and said capacitor (20) when controlled in a high conducting state thereof, wherein said second means includes second semiconductor means (79) that is non-conductive when said evaluating circuit means (70,70A) does not produce any evaluating signal, wherein said control means includes resistor means (80d–80f) responsive to non-conduction of said second semiconductor means (79) for biasing said first semiconductor means (50) in the low conducting state and responsive to conduction of said second semiconductor means (79) for biasing said first semiconductor means (50) in the high conducting state, and wherein said third means (30,40A) prohibits operation of said second semiconductor means (79) in response to the detection signal.

18. A releasing circuit for a safety device having a release element (10) actuable in response to a current sufficient for activation thereof provided through a current path from at least one of a battery (Ba) and a capacitor (20) charged by said battery (Ba) through said current path, the safety device actuable in response to activation of the release element (10) to protect passengers of a vehicle, comprising:

an acceleration sensor (71) arranged to provide an acceleration signal responsive to accelerations of the vehicle, evaluating circuit means (70,70A) for evaluating the acceleration signal from said acceleration sensor (71) in relation to a predetermined evaluating condition for supplying the sufficient current to the release element (10) from at least one of said battery (Ba) and said capacitor (20) and for generating an evaluating signal when the predetermined evaluation condition is satisfied, transistor circuit means (50,10a,60) provided within said current path for supplying a minute current continuously to the release element (10) from at least one of said battery (Ba) and said capacitor (20) through said current path when controlled in a low conducting state thereof and for supplying said sufficient current to the release element (10) from at least one of said battery (Ba) and said capacitor (20) through said current path when controlled in a high conducting state thereof, first means (79,10b,79c,80,80a–80f) including control means maintainable in a first condition to control said transistor circuit means (50,10a,60) in the low conducting state and maintainable in a second condition to control said transistor circuit means (50,10a,60) in the high conducting state, said first means arranged for effecting the first condition of said control means when said evaluating circuit means (70,70A) does not generate any evaluating signal and for effecting the second condition of said control means in response to the evaluation signal from said evaluating circuit means (70,70A), and second means (30,40,40A) including means for detecting a decrease of an electric voltage from at least one said battery (Ba) and said capacitor (20) to generate a detecting signal therefrom, said second means (30,40,40A) prohibiting operation of said transistor circuit means (50,10a,60) in response to the detecting signal.

19. A releasing circuit as recited in claim 18, wherein said transistor circuit means (50,10a,60) includes a transistor (50) and a resistor (10a) with a high resistance value which are provided in parallel with each other within said current path, said transistor (50) supplying a minute current continuously to the release element (10) from at least one of said battery (Ba) and said capacitor (20) through said resistor (10a) when said transistor (50) is controlled in a low conducting state thereof and for supplying said sufficient current to the release element (10) from at least one of said battery (Ba) and said capacitor (20) therethrough when controlled in a high conducting state thereof, wherein said control means is maintainable in the first condition to control said transistor (50) in the low conducting state and maintainable in the second condition to control said transistor (50) in the high conducting state, and wherein said second means (30,40,40A) prohibits operation of said transistor (50) in response to the detection signal.

20. A releasing circuit as recited in claim 18, wherein said transistor circuit means includes:

switch means (60) and a resistor (10a) with a high resistance value which are provided in parallel with each other within said current path, said switch means (60) shunting said resistor (10a) when actuated in response to an increase in a value of the acceleration signal from said acceleration sensor (71) up to a predetermined low value, and a transistor (50) associated with said switch means (60) and said resistor (10a) for supplying a minute current continuously to the release element (10) from at least one of said battery (Ba) and said capacitor (20) when controlled in a low conducting state thereof and for supplying said sufficient current to the release element (10) from at least one of said battery (Ba) and said capacitor (20) when controlled in a high conducting state thereof when said resistor (10a) is shunted, wherein said control means (80c,10b) is maintainable in the first condition to control said transistor (50) in the low conducting state and maintainable in the second condition to control said transistor (50) in the high conducting state, and wherein said second means (30,40,40A) prohibits operation of said transistor (50) in response to the detection signal.

21. A releasing circuit as recited in claim 18, wherein said first means (70,10b,79c,80,80a–80f) includes semiconductor means (79) that is non-conductive when said evaluating circuit means (70,70A) does not produce any evaluating signal and conductive in response to the evaluating signal from said evaluating circuit means (70,70A), and wherein said control means is a bias circuit means (10b,80,80a,80b) responsive to non-conduction of said semiconductor means for biasing said transistor circuit means (50,10a,60) in the low conducting state and responsive to conduction of said semiconductor means (79) for biasing said transistor circuit means (50,10a,60) in the high conducting state.

22. A releasing circuit as recited in claim 18, wherein said transistor circuit means (50,10a,60) includes a transistor (50) provided within said current path, said transistor circuit means (50,10a,60) supplying a minute current continuously to the release element (10) from at least one of said battery (Ba) and said capacitor (20) through said transistor (50) when said transistor (50) is controlled in a low conducting state thereof and for supplying said sufficient current to the release element (10) from at least one of said battery (Ba) and said capacitor (20) through said transistor (50) when said transistor (50) is controlled in a high conducting state thereof, wherein said first means includes semiconductor means (79) that is non-conductive when said evaluating circuit means (70,70A) does not produce any evaluating signal and conductive in response to the evaluating signal from said evaluating circuit means (70,70A), wherein said control means is a bias circuit means (10b,80a,80b) having a resistor circuit (80a,80b) connected to the base of said transistor (50), and a diode (80) provided within said resistor circuit (80a,80b), said bias circuit means (10b,80a,80b) responsive to non-conduction of said semiconductor means (79) for effecting non-conduction of said diode (80) by way of said resistor circuit (80a,80b) such that said transistor (50) is controlled in its low conducting state and responsive to conduction of said semiconductor means (79) for effecting conduction of said diode (80) such that said transistor (50) is controlled in its high conducting state, and wherein said second means (30,40,40A) prohibits operation of said transistor (50) in response to the detection signal.

23. A releasing circuit as recited in claim 22, wherein said transistor circuit means (50,10a,60) includes switch means (60) provided within said current path in series with said transistor (50) and closable in response to an increase in a value of the acceleration up to a predetermined low value to affect the current to the release element (10) through said transistor (50).

24. A releasing circuit as recited in claim 23, further comprising:

means (60a) provided within said current path between said switch means (60) and the release element (10) for determining a defect or malfunction of said switch means (60) as a function of an electric voltage appearing at said current path.

25. A releasing circuit as recited in claim 18, wherein said transistor circuit means (50,10a,60) includes a transistor (50) provided within said current path, said transistor circuit means supplying a minute current continuously to the release element (10) from at least one of said battery (Ba) and said capacitor (20) through said transistor (50) when said transistor (50) is controlled in a low conducting state thereof and for supplying said sufficient current to the release element (10) from at least one of said battery (Ba) and said capacitor (20) through said transistor (50) when said transistor (50) is controlled in a high conducting state thereof, wherein said first means includes semiconductor means (79) which is non-conductive when said evaluating circuit means (70,70A) does not produce any evaluating signal and conductive in response to the evaluating signal from said evaluating circuit means (70,70A), wherein said control means includes a resistor circuit (80d-80f) connected to the base of said transistor (50) and for biasing said transistor (50) in the low conducting state in response to non-conduction of said semiconductor means (79) and for biasing said transistor (50) in the high conducting state in response to conduction of said semiconductor means (79), and wherein said second means (30,40,40A) prohibits conduction of said semiconductor means (79) in response to the detection signal.

26. A releasing circuit for a safety device having a release element (10) actuable in response to a current sufficient for activation thereof provided from an electric power source (Ba,20) through a current path, the safety device actuable in response to activation of the release element (10) to protect passengers of a vehicle, comprising:

an acceleration sensor (71) arranged to provide an acceleration signal responsive to acceleration of the vehicle, evaluating circuit means (70,70A) for evaluating the acceleration signal from said acceleration sensor (71) in relation to a predetermined evaluating condition for supplying the sufficient current to the release element (10) from said electric power source (Ba,20) and for generating an evaluating signal when the predetermined evaluating condition is satisfied, first means (50,10a,60) arranged within said current path for controlling the supply of a current from said electric power source (Ba,20) to the release element (10), second means (80a,80e,79c,10b) for supplying a driving current for driving said first means to said first means from said electric power source (Ba,20), third means (79) responsive to the evaluating signal from said evaluating circuit means (70,70A) for cooperating with said first means (50,10a,60) so as to supply the sufficient current through said current path to the release element (10) from said electric power source (Ba,20), and fourth means (30,40,40A) for controlling said first means (50,10a,60) so as to prohibit supply of the sufficient current to the release element (10) when a predetermined prohibitive condition for prohibiting activation of the release element (10) is detected, wherein said second means includes limiting means (80a-80f) for limiting the driving current in a first current value before generation of the evaluating signal from said evaluating circuit means (70,70A), and said second means including means (80,79c,60) for switching over a value of the driving current from the first current value into a second current value larger than the first current value at the start of control by said third means (79), said means for switching over (80,79c,60) conditioning said first means (50,10a,60) in a mode enabling supply of the sufficient current to the release element (10) under control of said third means (79).

27. A releasing circuit as recited in claim 26, wherein said power source is a battery (Ba) and a capacitor (20), the capacitor (20) charged by said battery (Ba) through said current path, and wherein the release element (10) is supplied with a current through said current path from at least one of said battery (Ba) and said capacitor (20).

28. A releasing circuit as recited in claim 27, wherein said fourth means includes means (30) for detecting a decrease of an electric voltage from at least one of said battery (Ba) and said capacitor (20) to generate a detecting signal therefrom, said fourth means prohibiting operation of said first means (50,10a,60).

29. A releasing circuit as recited in claim 26, wherein said limiting means is a current-limitation resistor (10a) connected between said electric power source (Ba,20) and said first means (50,10a,60), and wherein said means for switching over (80,79c,60) is connected in parallel with said current-limitation resistor (10a) and includes switch means (60) responsive to the acceleration signal with a predetermined low value for disabling current limitation by said current-limitation resistor (10a) to switch over a value of the driving current from the first current value to a second current value larger than the first current value.

30. A releasing circuit as recited in claim 26, wherein said means for switching over (80,79c,60) includes means (80) responsive to operation of said third means (79) for changing a path of the driving current defined by said second means (80a,80e,79c,10b) into another path so as to switch over a value of the driving current from the first current value into a second current value larger than the first current value.

31. A releasing circuit as recited in claim 26, wherein said limiting means comprises a resistor means (80d,80f) connected to said first means, and wherein said means for switching over (80,79c,60) includes means (79b,80e) responsive to operation of said third means (79) for switching over a resistance value of said resistor means (80d,80f) into another resistance value so as to change a value of the driving current from the first current value into a second current value larger than the first current value.

32. A releasing circuit for a safety device having a release element (10) actuable in response to a current sufficient for activation thereof from an electric power source (Ba,20) provided through a current path, the safety device actuable in response to activation of the release element (10) to protect passengers of a vehicle, comprising:

an acceleration sensor (71) arranged to provide an acceleration signal responsive to the accelerations of the vehicle, evaluating circuit means (70,70A) for evaluating the acceleration signal from said acceleration sensor (71) in relation to a predetermined evaluating condition for supplying the sufficient current to the release element (10) from said electric power source (Ba,20) and for generating an evaluating signal when the predetermined evaluating condition is satisfied, first means (50,10a,60) arranged within said current path for controlling the supply of a current from said electric power source (Ba,20) to the release element (10), second means (80a–80e,79c,10b) for supplying a driving current for driving said first means (50,10a,60) to said first means from said electric power source (Ba,20), third means (79) responsive to the evaluating signal from said evaluating circuit means (70,70A) for cooperating with said first means (50,10a,60) so as to supply the sufficient current through said current path to the release element (10) from said electric power source (Ba,20), and fourth means (30,40,40a) for controlling said first means so as to prohibit supply of the sufficient current to the release element (10) when a predetermined prohibitive condition for prohibiting activation of the release element (10) is detected, wherein said second means includes limiting means (80a–80d,80f) for limiting the driving current to a first current value until operation of said third means (79), said second means including means (80,79c,60) responsive to operation of said third means (79) for switching over a value of the driving current from the first current value into a second current value larger than the first current value, said means for switching over (80,79c,60) conditioning said first means in a mode enabling supply of the sufficient current to the release element (10) under control of said third means (79).

33. A releasing circuit as recited in claim 32, wherein said electric power source (Ba,20) is a battery (Ba) and a capacitor (20), the capacitor (20) charged by said battery (Ba) through said current path, and wherein the release element (10) is supplied with a current through said current path from at least one of said battery (Ba) and said capacitor (20).

34. A releasing circuit as recited in claim 33, wherein said fourth means (30,40,40a) includes means for detecting a decease of an electric voltage from at least one of said battery (Ba) and said capacitor (20) to generate a detecting signal therefrom, said fourth means (30,40,40a) prohibiting operation of said first means (50,10a,60).

35. A releasing circuit for a safety device having a release element (10) actuable in response to a current sufficient for activation thereof provided from an electric power source (Ba,20) through a current path, the safety device actuable in response to activation of the release element (10) to protect passengers of a vehicle, comprising:

an acceleration sensor (71) arranged to provide an acceleration signal responsive to the accelerations of the vehicle, evaluating circuit means (70,70A) for evaluating the acceleration signal from said acceleration sensor (71) in relation to a predetermined evaluating condition for supplying the sufficient current to the release element (10) and for generating an evaluating signal when the predetermined evaluating condition is satisfied, a transistor (50) arranged within said current path for controlling the supply of a current from said electric power source (Ba,20) to the release element (10), first means (80a,80b) for supplying a driving current to a base of said transistor (50) from said electric power source (Ba,20), second means (79) responsive to the evaluating signal from said evaluating circuit means (70,70A) for cooperating with said transistor (50) so as to supply the sufficient current through said current path to the release element (10) from said electric power source (Ba,20), and third means (30,40) for controlling said transistor (50) so as to prohibit supply of the sufficient current to the release element (10) when a predetermined prohibitive condition for prohibiting activation of the release element (10) is detected, wherein said first means (80a,80ba) includes limiting means (80a,80b) for limiting the driving current to a first current value before generation of the evaluating signal from said evaluating circuit means (70,70A), and said second means including means (80) for switching over a value of the driving current from the first current value upon control by said second means (79), said means for switching over conditioning said transistor (50) in a mode enabling supply of the sufficient current into the release element (10) under control of said second means (79).

36. A releasing circuit as recited in claim 35, wherein said electric power source (Ba,20) is a battery (Ba) and a capacitor (20), the capacitor (20) charged by said battery (Ba) through said current path, and wherein the release element (10) is supplied with a current through said current path from at least one of said battery (Ba) and said capacitor (20).

37. A releasing circuit as recited in claim 36, wherein said third means (30,40) includes means (30) for detecting a decrease of an electric voltage from at least one of said battery (Ba) and said capacitor (20) to generate a detecting signal therefrom, said third means (30,40) prohibiting operation of said transistor (50).

38. A releasing circuit as claimed in claim 35, wherein said first means includes a base resistor (80a,80b) connected to the base of said transistor (50), and wherein said means for switching over includes means (80) responsive to operation of said second means (79) for changing a path of a base current through said base resistor (80a,80b) flowing into said transistor (50) so as to change over a value of the base current to a second current value larger than the first current value.

39. A releasing circuit as recited in claim 35, wherein said first means includes a base resistor (80d,80e,80f) connected to the base of said transistor (50), and wherein said means for switching over includes means (79c) responsive to operation of said second means (79) for changing a resistance value of said base resistor into another resistance value so as to switch over a value of a base current through said base resistor flowing into said transistor (50) to a second current value larger than the first current value.

40. A releasing circuit as recited in claim 38, further comprising switch means (60) arranged in series with said transistor (50) to be closed in response to the acceleration having a predetermined low value.

41. A releasing circuit as recited in claim 40, further comprising abnormal detection means for detecting an abnormality of said switch means (60) in relation to an electric voltage appearing said current path.

* * * * *